(12) United States Patent  
Maehara et al.

(10) Patent No.: US 7,936,035 B2
(45) Date of Patent: May 3, 2011

(54) PHOTOELECTRIC CONVERSION ELEMENT, SOLID-STATE IMAGE PICKUP DEVICE, AND MANUFACTURING METHOD OF THE PHOTOELECTRIC CONVERSION ELEMENT

(75) Inventors: Yoshiki Maehara, Ashigarakami-gun (JP); Takashi Goto, Ashigarakami-gun (JP); Kiyohiko Tsutsumi, Minami-Ashigara (JP); Kyohei Ogawa, Minami-Ashigara (JP); Takashi Komiyama, Ashigarakami (JP); Takeshi Senga, Minami-Ashigara (JP); Takehiro Kasahara, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/198,370

(22) Filed: Aug. 26, 2008

(65) Prior Publication Data  
US 2009/0057659 A1 Mar. 5, 2009

(30) Foreign Application Priority Data  
Aug. 27, 2007 (JP) ................................. 2007-220012

(51) Int. Cl.  
*H01L 31/00* (2006.01)
(52) U.S. Cl. .............. 257/440; 257/40; 257/59; 257/72; 257/222; 257/225; 257/E27.133; 257/292
(58) Field of Classification Search .................... 257/40, 257/59, 72, 222, 225, 440, E27.133, 292  
See application file for complete search history.

(56) References Cited

U.S. PATENT DOCUMENTS

| 4,377,628 A * | 3/1983 | Ishioka et al. ............... 430/57.6 |
| 5,085,904 A * | 2/1992 | Deak et al. .................... 428/35.7 |
| 7,179,527 B2 * | 2/2007 | Sato et al. ..................... 428/333 |
| 7,390,601 B2 * | 6/2008 | Wu et al. ....................... 430/58.8 |
| 2005/0263183 A1 * | 12/2005 | Nishikitani et al. .......... 136/263 |
| 2007/0057339 A1 * | 3/2007 | Mitsui et al. .................. 257/432 |
| 2007/0120045 A1 * | 5/2007 | Yokoyama ............... 250/214 R |

FOREIGN PATENT DOCUMENTS

JP 5-129576 A 5/1993  
WO WO 2007074977 A1 * 7/2007

* cited by examiner

*Primary Examiner* — N Drew Richards  
*Assistant Examiner* — Yu-Hsi Sun  
(74) *Attorney, Agent, or Firm* — Sughrue Mion, PLLC

(57) ABSTRACT

A photoelectric conversion element comprises: a pair of electrodes; and an organic photoelectric conversion layer between the pair of electrodes, wherein one of the electrodes is a first electrode that collects electrons generated in the organic photoelectric conversion layer; the other one of the electrodes is a second electrode that collects holes generated in the organic photoelectric conversion layer; and the photoelectric conversion element further comprises a hole blocking layer that comprises silicon oxide and inhibits injection of holes into the organic photoelectric conversion layer from the first electrode while applying a bias voltage between the electrodes, the hole blocking layer being disposed between the first electrode and the organic photoelectric conversion layer, and an oxygen/silicon composition ratio of the silicon oxide is 0.5 or greater and 1.2 or less.

13 Claims, 6 Drawing Sheets

PHOTOELECTRIC CONVERSION ELEMENT, SOLID-STATE IMAGE PICKUP DEVICE, AND MANUFACTURING METHOD OF THE PHOTOELECTRIC CONVERSION ELEMENT

BACKGROUND OF THE INVENTION

1. Field of the Invention

The present invention relates to a photoelectric conversion element having a pair of electrodes and an organic photoelectric conversion layer disposed between the electrodes.

2. Description of the Related Art

Organic photoelectric conversion elements having a pair of electrodes and an organic photoelectric conversion layer formed between the electrodes and composed of an organic material are known in the related art. In such organic photoelectric conversion elements, the greater the electric field intensity to be applied to the organic photoelectric conversion layer, the greater the external quantum efficiency at the time of light irradiation. When a large voltage is applied, however, holes and electrons are injected into the organic photoelectric conversion layer from the pair of electrodes and this causes an increase in a dark current, leading to deterioration in an SN ratio. In order to overcome this problem, JP-A-5-129576 discloses an organic photoelectric conversion element having a charge blocking layer made of silicon oxide between one of the electrodes and the organic photoelectric conversion layer

SUMMARY OF THE INVENTION

According to the data in Examples disclosed in the above-described patent document, however, the dark current of the device is $6.5 \times 10^{-9}$ A·cm$^{-2}$ at the minimum and an SN ratio is from approximately 300 to 500. It can hardly be said that the device having such values is suited as an image pickup device.

With the foregoing in view, the invention has been completed. An object of the invention is to provide a photoelectric conversion element capable of improving an SN ratio while suppressing a dark current.

In one aspect of the invention, there is thus provided a photoelectric conversion element comprising: a pair of electrodes; and an organic photoelectric conversion layer between the pair of electrodes, wherein one of the electrodes is a first electrode that collects electrons generated in the organic photoelectric conversion layer; the other one of the electrodes is a second electrode that collects holes generated in the organic photoelectric conversion layer; and the photoelectric conversion element further comprises a hole blocking layer that comprises silicon oxide and inhibits injection of holes into the organic photoelectric conversion layer from the first electrode while applying a bias voltage between the electrodes, the hole blocking layer being disposed between the first electrode and the organic photoelectric conversion layer, and an oxygen/silicon composition ratio of the silicon oxide is 0.5 or greater and 1.2 or less.

In the photoelectric conversion element according to the invention, at least one of the electrodes may comprise a transparent conductive oxide.

In another aspect of the invention, there is also provided a solid-state image pickup device comprising: a substrate: the photoelectric conversion element over the substrate; and a signal readout portion that reads out signals responsive to signal charges generated in the photoelectric conversion element.

The solid-state image pickup device of the invention may further comprise, in the substrate, another photoelectric conversion element that detects light which has passed through the photoelectric conversion element.

In the solid-state image pickup device of the invention, the signal readout portion may be a CMOS type or a CCD type signal readout portion.

In the solid-state image pickup device according to the invention, the substrate, the second electrode and the first electrode may be arranged in this order; the device may further comprise, in the substrate, a hole storage portion that stores holes collected by the hole collecting electrode; and the signal readout portion may output signals responsive to the holes stored in the hole storage portion.

In a further aspect of the invention, there is also provided a manufacturing method of a photoelectric conversion element comprising a pair of electrodes and an organic photoelectric conversion layer between the electrodes, the method comprising; forming one of the electrodes over a substrate; forming the organic photoelectric conversion layer over the one of the electrodes; forming the other one of the electrodes over the organic photoelectric conversion layer, and forming, when the one of the electrodes is a first electrode that collects electrons generated in the organic photoelectric conversion layer, a hole blocking layer that inhibits injection of holes into the organic photoelectric conversion layer from the one of the electrodes by heating and depositing silicon monoxide on the one of the electrodes at a degree of vacuum of $1 \times 10^{-4}$ Pa or less prior to the forming of the organic photoelectric conversion layer and forming, when the other one of the electrodes is the first electrode, a hole blocking layer that inhibits injection of holes into the organic photoelectric conversion layer from the other one of the electrodes by heating and depositing silicon monoxide on the organic photoelectric conversion layer at a degree of vacuum of $1 \times 10^{-4}$ Pa or less prior to the forming of the other one of the electrodes.

In the manufacturing method of a photoelectric conversion element according to the invention, the forming of the organic photoelectric conversion layer, the forming of the other one of the electrodes over the organic photoelectric conversion layer and the forming the hole blocking layer may be all performed in vacuum.

The present invention can provide a photoelectric conversion element having an improved SN ratio by reducing a dark current.

DETAILED DESCRIPTION OF THE INVENTION

Embodiments of the invention will hereinafter be described referring to accompanying drawings.

First Embodiment

Figure 1:
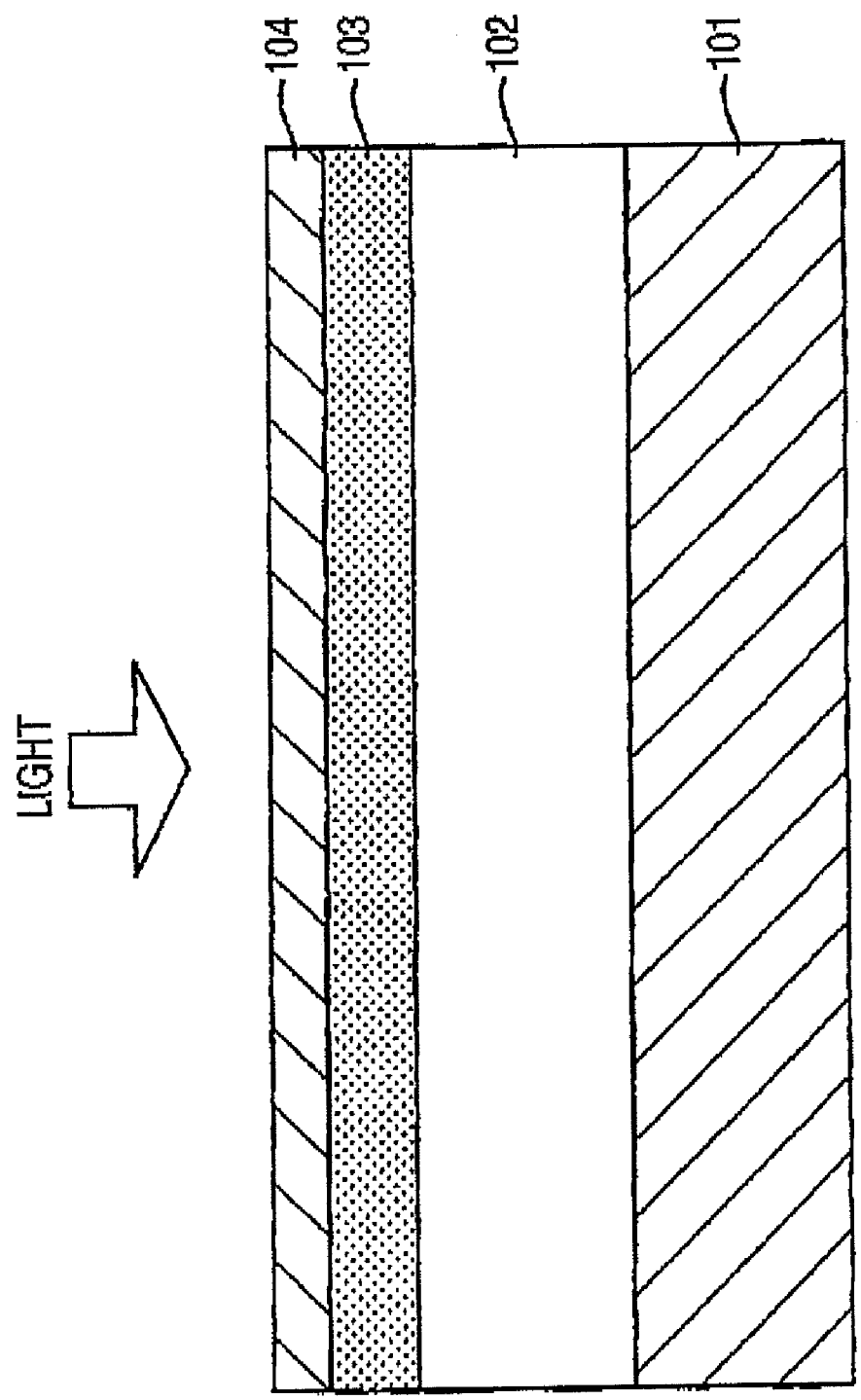
FIGS. 1 is a cross-sectional schematic view of a photoelectric conversion element according to a first embodiment of the invention.

FIG. 1 is a cross-sectional schematic view of a photoelectric conversion element according to a first embodiment of the present invention.

The photoelectric conversion element illustrated in FIG. 1 has a lower electrode 101, a photoelectric conversion layer 102 formed on the lower electrode 101, a hole blocking layer 103 formed on the photoelectric conversion layer 102, and an upper electrode 104 formed on the hole blocking layer 103.

The photoelectric conversion layer 102 is composed of an organic material having a photoelectric conversion function, more specifically, a function of absorbing light of a specific wavelength range and generating a charge (electron-hole pair) responsive to the absorbed amount of light. As the organic material, various organic semiconductor materials employed for, for example, electrophotographic sensitive materials can be used. Of these, organic materials such as quinacridone, phthalocyanine or their derivatives are especially preferred from the viewpoint that they have a high photoelectric conversion performance, are excellent in color separation in spectroscopy, have high durability against exposure to light for long hours, and can be readily deposited in vacuum.

The photoelectric conversion layer 102 using, for example, quinacridone represented by the following chemical formula 1 as its material can absorb light of a green wavelength range and generate charges responsive to it. On the other hand, the photoelectric conversion layer 102 using, for example, zinc phthalocyanine represented by the following chemical formula 2 as its material can absorb light of a red wavelength range and generate charges responsive to it.

The photoelectric conversion layer 102 can be made thinner than that of the related-art constitution in which the upper electrode 104 is formed directly on the photoelectric conversion layer 102, because in this embodiment, the hole blocking layer 103 formed on the photoelectric conversion layer 102 serves to reduce the damage which will otherwise be given to the photoelectric conversion layer 102 at the time of forming the upper electrode 104. The thickness of the photoelectric conversion layer 102 is preferably from approximately 10 nm to 200 nm in view of an optical absorptance and reduction of a bias voltage.

Chemical formula 1

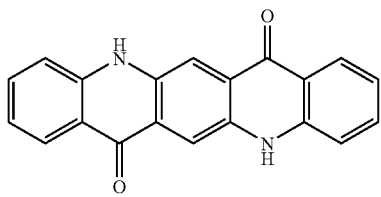

Chemical formula 2

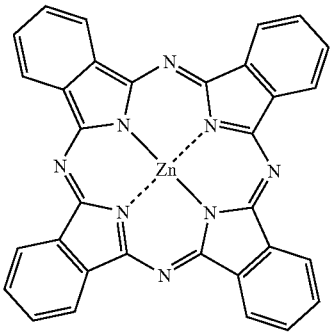

In the photoelectric conversion element illustrated in FIG. 1, light is made incident from above the upper electrode 104. In addition, in the photoelectric conversion element illustrated in FIG. 1, a bias voltage is applied between the lower electrode 101 and the upper electrode 104 to enable transfer of holes, among charges (holes and electrons) generated in the photoelectric conversion layer 102, to the lower electrode 101 and transfer of the electrons to the upper electrode 104. In other words, the upper electrode 104 is functioned as an electrode for collecting electrons generated in the photoelectric conversion layer 102, while the lower electrode 101 is functioned as an electrode for collecting holes generated in the photoelectric conversion layer 102. This photoelectric conversion element can be used as a photoelectric conversion element for image pickup device by reading signals responsive to the electrons collected by the upper electrode 104 to the outside by an MOS circuit or CCD which treats the electrons as carriers or reading signals responsive to the holes collected by the lower electrode 101 to the outside by an MOS circuit or CCD which treats the holes as carriers.

The upper electrode 104 is made of a conductive material transparent to light of from a visible range to an infrared range because light is made incident into the photoelectric conversion layer 102. As the transparent conductive material, transparent conductive oxides such as indium tin oxide (ITO) are preferred from the viewpoint of an easy production step.

The lower electrode 101 is not necessarily transparent insofar as it is a conductive material. In the photoelectric conversion element illustrated in FIG. 1, however, the lower electrode 101 is preferably made of a transparent conductive material because, as will be described later, it sometimes becomes necessary to transmit light to a portion below the lower electrode 101. Similar to the upper electrode 104, the lower electrode is preferably made of a transparent conductive oxide such as ITO.

The hole blocking layer 103 is made of a material transparent to light of from a visible range to an infrared range because light must be made incident into the photoelectric conversion layer 102. In addition, the hole blocking layer 103 has a function of suppressing injection of holes from the upper electrode 104 to the photoelectric conversion layer 102 when a bias voltage is applied between the lower electrode 101 and the upper electrode 104. Moreover, the hole blocking layer 103 must be imparted with a function of transporting electrons generated in the photoelectric conversion layer 102 to the upper electrode 104. When the lower electrode 101 is functioned as an electron collecting electrode, the hole blocking layer 103 may be placed between the photoelectric conversion layer 102 and the lower electrode 101.

When the upper electrode 104 is formed directly on the photoelectric conversion layer 102 without forming the hole blocking layer 103, the photoelectric conversion layer 102 may be damaged at the time of forming the upper electrode 104, an interaction may occur between the organic material of the photoelectric conversion layer 102 and the material of the upper electrode 104, or a new localized level may be formed at the interface between the photoelectric conversion layer 102 and the upper electrode 104. The hole blocking layer 103 can prevent an increase in a dark current which will otherwise be caused by acceleration of hole injection from the upper electrode 104 via this localized level. The hole blocking layer is preferably made of a stable inorganic material which does not easily react with either one or both of the material of the photoelectric conversion layer 102 and the material of the upper electrode 104. Since the number of localized levels is proportion to the area of the interface with the upper electrode 104, the hole blocking layer 104 is preferably amorphous in order to flatten the interface with the electrode as much as possible. Moreover, in order to prevent penetration of water or oxygen responsible for the deterioration of the photoelectric conversion layer 102 after formation of the photoelectric conversion layer 102, the hole blocking layer is preferably made of a material which enables continuous formation with the photoelectric conversion layer 102 and the upper electrode 104 by physical vapor deposition such as vapor deposition, sputtering, ion plating, or molecular beam epitaxy under vacuum conditions.

Examples of the inorganic material capable of satisfying the above-described condition include oxides such as aluminum oxide, silicon oxide, titanium oxide, vanadium oxide, manganese oxide, iron oxide, cobalt oxide, zinc oxide, niobium oxide, molybdenum oxide, cadmium oxide, indium oxide, tin oxide, barium oxide, tantalum oxide, tungsten oxide, and iridium oxide. These oxides are preferably oxides whose oxygen content is lower than that of their stoichiometric composition because the hole blocking layer made of such an oxide has an enhanced electron transporting property. An organic photoelectric conversion element having a reduced dark current and an improved SN ratio can be realized by forming the hole blocking layer 103 made of such an inorganic material between the photoelectric conversion layer 102 and the upper electrode 104 for collecting electrons, thereby suppressing injection of holes from the upper electrode 104 without reducing the external quantum efficiency.

The present inventors have found that by using silicon oxide for the hole blocking layer 103 and adjusting an oxygen composition ratio x of silicon oxide relative to silicon to 0.5 or greater and 1.2 or less, hole injection from the upper electrode 104 can be controlled more efficiently without deteriorating the electron transporting performance compared with the related-art hole blocking layer. The effect of controlling the hole injection will be described later in Example.

The charge transporting property of the photoelectric conversion layer 102 is described in detail in JP-A-2007-80936 and JP-A-2007-81137.

In the following Second to Fourth embodiments, a constitution example of a sensor obtained by stacking a photoelectric conversion element as described above over a semiconductor substrate will be described.

Second Embodiment

Figure 2:
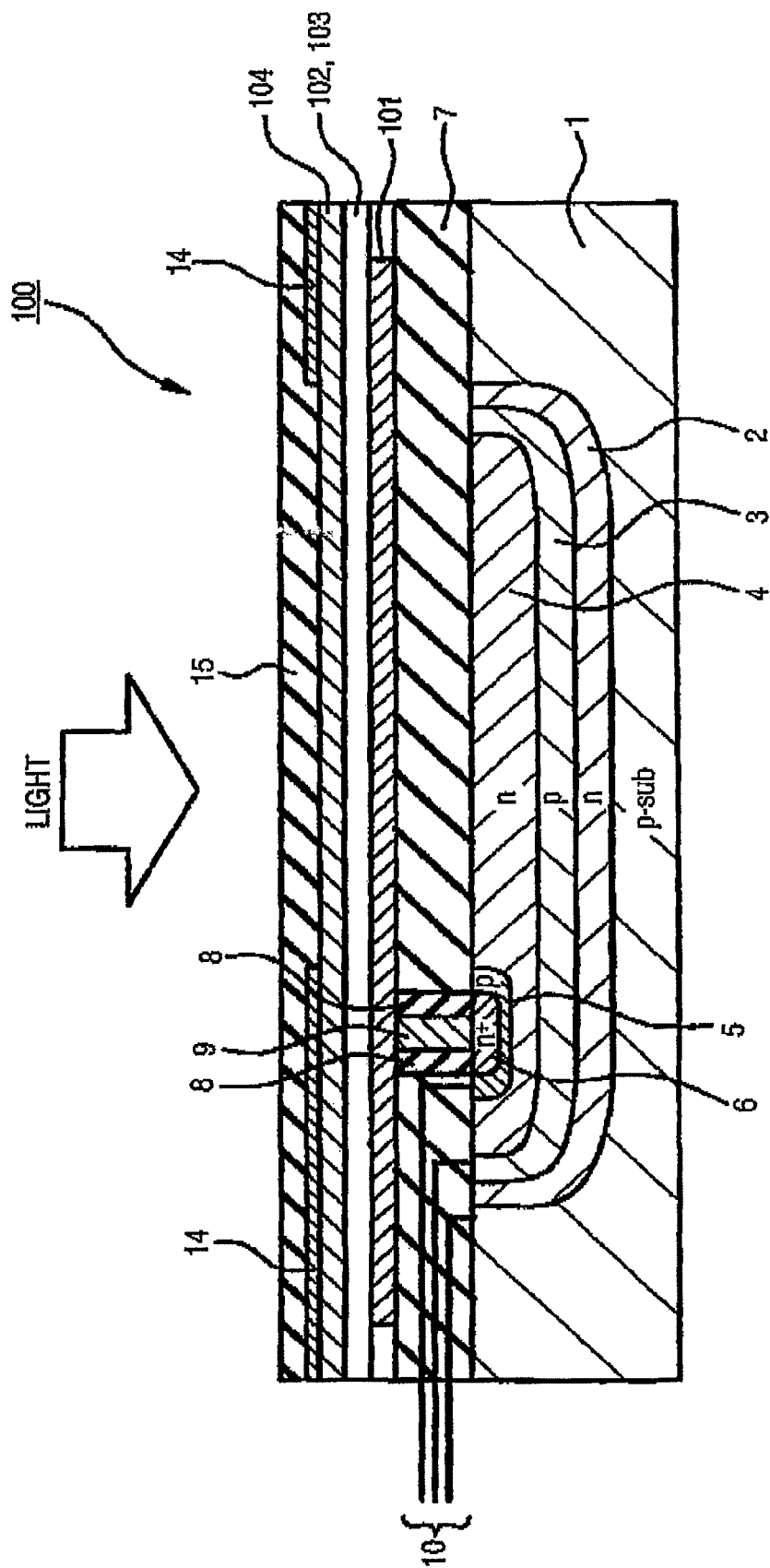
FIG. 2 is a cross-sectional schematic view of a solid-state image pickup device corresponding to one pixel for describing a second embodiment of the invention.

FIG. 2 is a cross-sectional schematic view of a solid-state image pickup device corresponding to one pixel for describing a second embodiment of the invention. In FIG. 2, similar members are designated by the same reference numerals as those in FIG. 1.

This solid-state image pickup device has a number of pixels, each of which is illustrated in FIG. 2, arranged in an array form on one plane and by a signal available from this pixel, pixel data of image data can be formed.

Each pixel of the solid-state image pickup device illustrated in FIG. 2 comprises a photoelectric conversion element having the structure, as described in the first embodiment, composed of a p type Si substrate 1, a transparent insulating film 7 formed on the p type Si substrate 1, a lower electrode 101 formed on the insulating film 7, a photoelectric conversion layer 102 formed on the lower electrode 101, a hole blocking layer 103 (not illustrate) formed on the photoelectric conversion layer 102, and an upper electrode 104 formed on the hole blocking layer 103. Over the photoelectric conversion element, a light shielding film 14 having an opening therein is formed. Over the upper electrode 104, a transparent insulating film 15 is formed.

In the p type Si substrate 1, an n type impurity region (which will hereinafter be abbreviated as "n region") 4, a p type impurity region (which will hereinafter be abbreviated as "p region") 3, and an n region 2 are formed in order of mention from the shallow part of the p type Si substrate. On the surface portion of the n region 4 shielded by the light shielding film 14, a high-concentration n region (which will hereinafter be called "$n^+$ region") 6 is formed and the circumference of the $n^+$ region 6 is encompassed with a p region 5.

The depth of the pn junction plane between the n region 4 and the p region 3 from the surface of the p type Si substrate 1 corresponds to a depth (about 0.2 μm) for absorbing blue light. Accordingly, the n region 4 and the p region 3 form a photodiode (B photodiode) for absorbing blue light and storing charges responsive to it. Electrons generated in the B photodiode are stored in the n region 4.

The depth of the pn junction plane between the n region 2 and the p type Si Substrate 1 from the surface of the p type Si substrate 1 corresponds to a depth (about 2 μm) for absorbing red light. Accordingly, the n region 2 and the p type Si substrate 1 form a photodiode (R photodiode) for absorbing red light and storing charges responsive thereto. Electrons generated in the R photodiode are stored in the n region 2.

The $n^+$ region 6 is electrically connected to the lower electrode 101 via a connecting portion 9 formed in an opening made in the insulating film 7. Holes collected in the lower electrode 101 recombine with electrons in the $n^+$ region 6 so that the number of electrons stored in the $n^+$ region 6 at the time of reset decreases, depending on the number of collected holes. The connecting portion 9 is electrically insulated from members other than the lower electrode 101 and the $n^+$ region 6 by an insulating film 8.

The electrons stored in the n region 2 are converted into signals responsive to their charge quantity by an MOS circuit (not illustrated) composed of an n channel MOS transistor formed in the p type Si substrate 1; the electrons stored in the n region 4 are converted into signals responsive to their charge quantity by an MOS circuit (not illustrated) composed of an n channel MOS transistor formed in the p region 3; and the electrons stored in the $n^+$ region 6 are converted into signals responsive to their charge quantity by an MOS circuit (not illustrated) composed of an n channel MOS transistor formed in the p region S. These signals are output to the outside of the solid-state image pickup device 100. Each of the MOS circuits is connected to an unillustrated readout pad via a wiring 10. When an extraction electrode is placed in the n region 2 and the n region 4 and a predetermined reset potential is applied thereto, depletion of each region occurs and the capacitance of each pn junction portion becomes as small as possible. This makes it possible to minimize the capacitance generated on the junction face.

Due to such a constitution, G light is photoelectrically converted in the photoelectric conversion layer 102 and B light and R light can be photoelectrically converted in the B photodiode and the R photodiode in the p type Si substrate 1, respectively. Since conversion of G light is conducted first in the upper portion, color separation between B-G and G-R is excellent. It is an advantage of the solid-state image pickup device of the invention compared with a solid-state image pickup device configured to have three photodiodes stacked in the Si substrate and perform separation of B light, G light and R light from each other only in the Si substrate.

A CCD type signal readout portion composed of a CCD for transferring charges and an output amplifier for converting charges thus transferred into a voltage signal may be employed instead of the MOS circuit.

Third Embodiment

In this embodiment, light of two colors is detected in the p type Si substrate not by stacking two photodiodes in the Si substrate 1 as illustrated in FIG. 2 but by arranging two photodiodes in a direction vertical to the incident direction of incident light.

Figure 3:
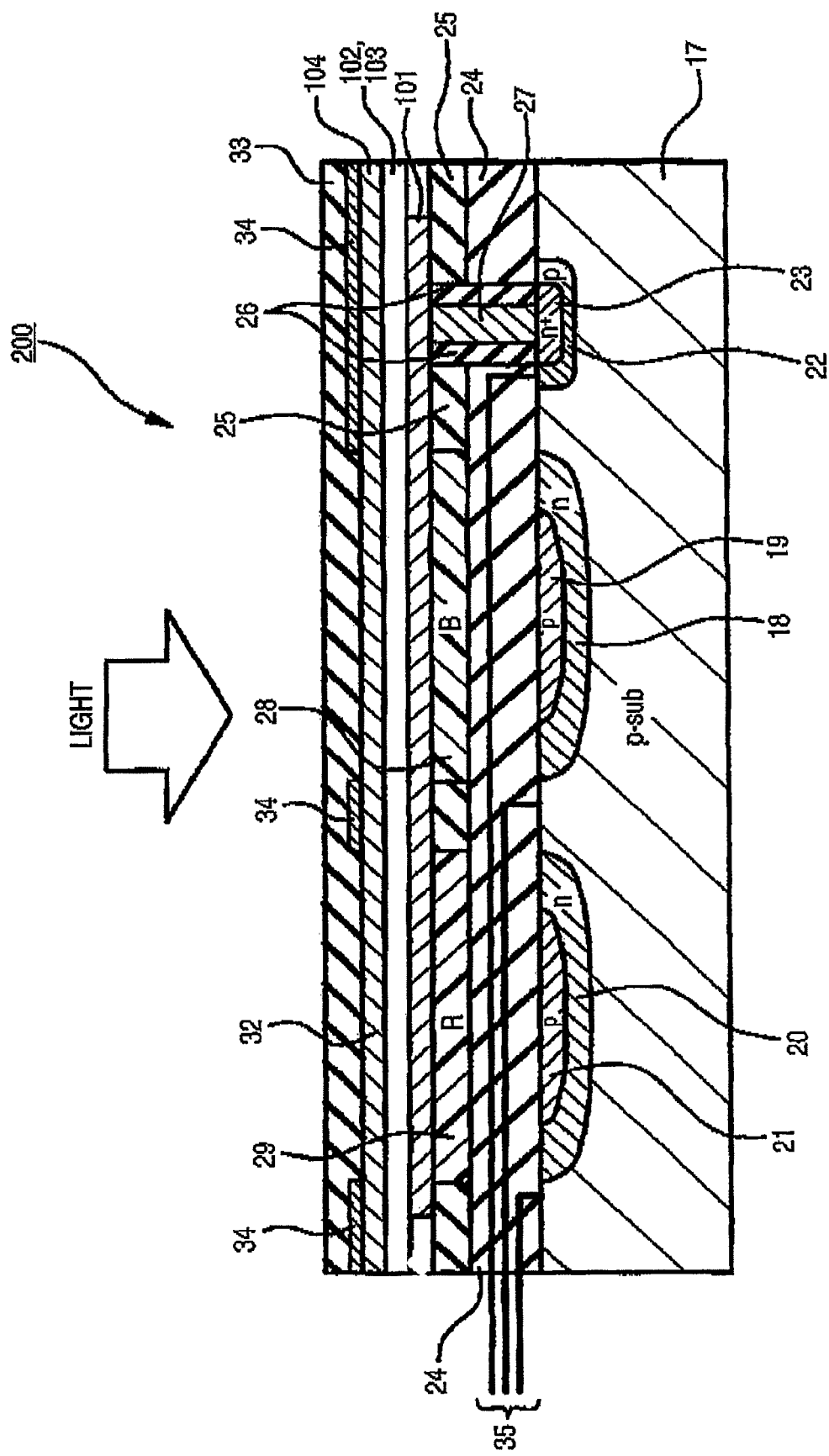
FIG. 3 is a cross-sectional schematic view of a solid-state image pickup device corresponding to one pixel for describing a third embodiment of the invention.

FIG. 3 is a cross-sectional schematic view of a solid-state image pickup device corresponding to one pixel for describing the third embodiment of the invention. In FIG. 2, similar members are designated by the same reference numerals as those in FIG. 1.

Each pixel of the solid-state image pickup device 200 illustrated in FIG. 3 comprises a photoelectric conversion element having the structure, as described in the first embodiment, composed of a p type Si substrate 17, a lower electrode 101 formed over the p type Si substrate 17, a photoelectric conversion layer 102 forced on the lower electrode 101, a hole blocking layer 103 (not illustrated) formed on the photoelectric conversion layer, and an upper electrode 104 formed on the hole blocking layer 103. Over the photoelectric conversion element, a light shielding film 34 having an opening therein is formed. Over the upper electrode 104, a transparent insulating film 33 is formed.

In the surface of the p type Si substrate 17 below the opening of the light shielding film 34, a photodiode made of a p region 19 and an n region 18 and another photodiode made of a p region 21 and an n region 20 are aligned. An arbitrary plane direction on the surface of the p type Si substrate 17 is perpendicular to the incident direction of incident light.

A color filter 28 through which B light passes is formed over the photodiode made of the p region 19 and the n region 18 via a transparent insulating film 24 and the lower electrode 101 is formed over the color filter 28. A color filter 29 through which R light passes is formed over the photodiode made of the p region 21 and the n region 20 via the transparent insulating film 24 and the lower electrode 101 is formed over the color filter 29. The color filters 28 and 29 are each encompassed with a transparent insulating film 25.

The photodiode made of the p region 19 and the n region 18 absorbs the B light which has passed through the color filter 28 and generates electrons responsive to it and accumulates the thus-generated electrons in the n region 18. The photodiode made of the p region 21 and the n region 20 absorbs the R light which has passed through the color filter 29 and generates the thus-generated electrons responsive to it and accumulates the thus-generated electrons in the n region 20.

A portion shielded by the light shielding film 34 in the surface of the p type Si substrate 17, an $n^+$ region 23 is formed and the $n^+$ region 23 is encompassed with a p region 22.

The $n^+$ region 23 is electrically connected to the lower electrode 101 via a connecting portion 27 formed in the opening made in the insulating films 24 and 25. Holes collected in the lower electrode 101 recombine with electrons in the $n^+$ type region 23 so that the number of electrons stored in the $n^+$ region 23 at the reset time decreases depending on the number of holes collected. The connecting portion 27 is electrically insulated from members other than the lower electrode 101 and the $n^+$ region 23 by an insulating film 26.

Electrons stored in the n region 18 are converted into signals responsive to their charge quantity by an MOS circuit (not illustrated) composed of an n channel MOS transistor formed in the p type Si substrate 17; electrons stored in the n region 20 are converted into signals responsive to their charge quantity by an MOS circuit (not illustrated) composed of an n channel MOS transistor formed in the p type Si substrate 17; and electrons stored in the $n^+$ region 23 are converted into signals responsive to their charge quantity by an MOS circuit (not illustrated) composed of an n channel MOS transistor formed in the p region 22. These signals are output to the outside of the solid-state image pickup device 200. Each of the MOS circuits is connected to an unillustrated readout pad via a wiring 35.

Alternatively, the signal readout portion may be made up of a CCD and an amplifier not of MOS circuits. Described specifically, the signal readout portion may be configured so that electrons stored in the n region 18, the n region 20, and the $n^+$ region 23 are read out into the CCD formed in the p-type Si substrate 17 and then transferred to the amplifier through the CCD, and signals responsive to the electrons thus transferred are output from the amplifier.

Although the structure of the signal readout portion can be a CCD or CMOS structure as described above, it is preferably a CMOS structure from the viewpoint of power consumption, high-speed readout, pixel addition, and partial readout.

Incidentally, in FIG. 3, color separation between R light and B light is effected using color filters 28 and 29. However, instead of disposing these color filters 28 and 29, color separation may be effected by adjusting individual depths of the pn junction plane between the n region 20 and the p region 21 and the pn junction plane between the n region 18 and the p region 19 to appropriate values respectively to enable absorption of R light and B light by their corresponding photodiodes. In this case, it is also possible to form, between the p-type Si substrate 17 and the lower electrode 101 (for example, between the insulating film 24 and the p-type Si substrate 17) an inorganic photoelectric conversion portion made of an inorganic material and capable of absorbing light which has passed through the photoelectric conversion layer 102, generating charges responsive to the absorbed light, and storing the charges. In this case, it is only necessary to provide a MOS circuit for reading out signals responsive to the charges stored in a charge storage region of the inorganic photoelectric conversion portion in the p-type Si substrate 17 and to connect a wiring 35 to this MOS circuit.

Alternatively, the image pickup device may also be configured so that the number of photodiodes provided in the p-type silicon substrate 17 is one and a plurality of photoelectric conversion portions are stacked one after another over the p-type Si substrate 17, or so that a plurality of photodiodes are provided in the p-type Si substrate 17 and a plurality of photoelectric conversion portions are stacked one after another over the p-type Si substrate 17. If it is not necessary to produce color images, the image pickup device may be configured to have one photodiode in the p-type Si substrate 17 and stack one photoelectric conversion portion thereover.

Fourth Embodiment

A solid-state image pickup device according to this embodiment has no photodiode provided in the Si substrate illustrated in FIG. 1 but is configured so that a plurality of (three in this embodiment) photoelectric conversion elements are stacked one after another over the Si substrate.

Figure 4:
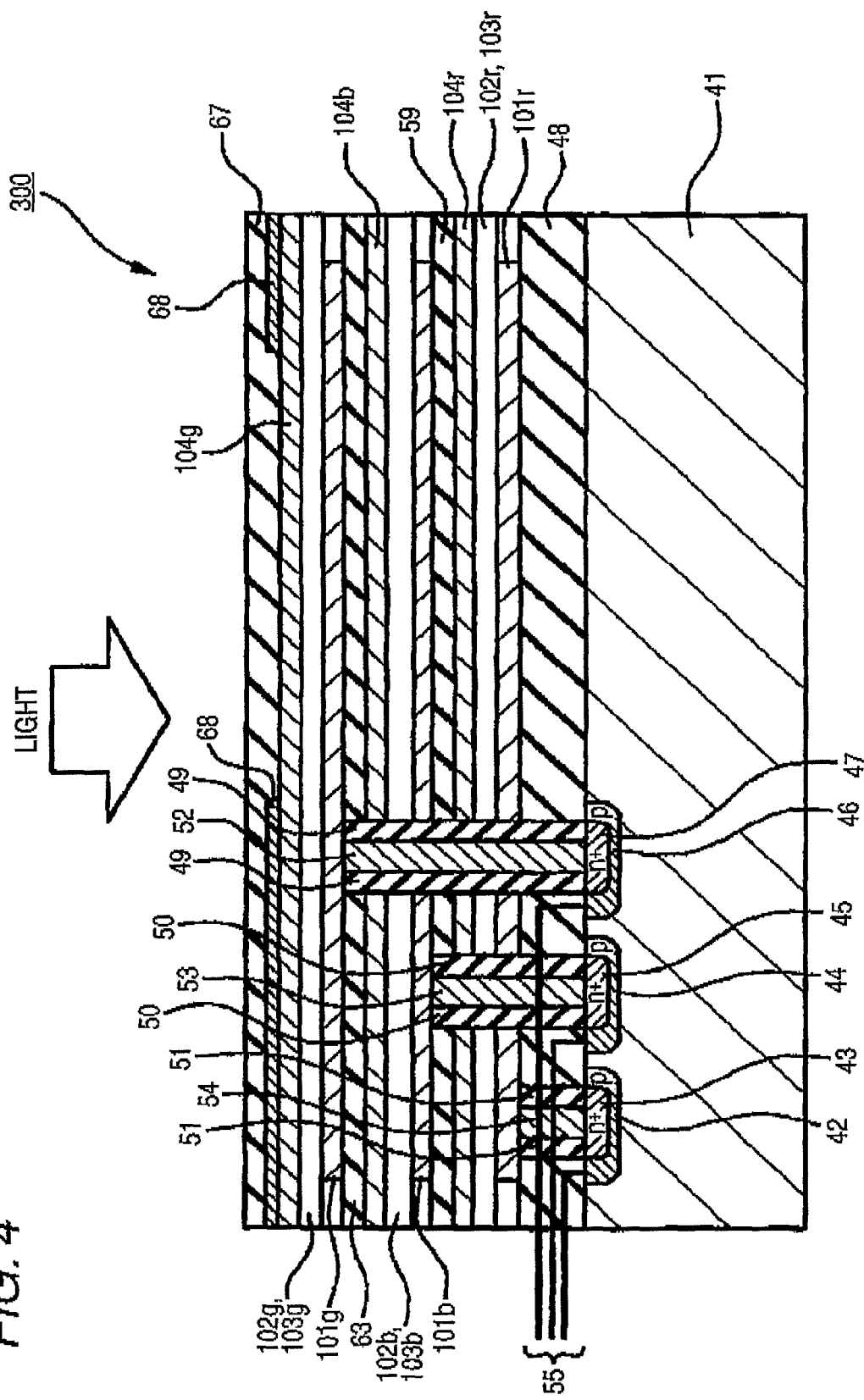
FIG. 4 is a cross-sectional schematic view of a solid-state image pickup device corresponding to one pixel for describing a fourth embodiment of the invention.

FIG. 4 is a cross-sectional schematic view of a solid-state image pickup device corresponding to one pixel for describing the fourth embodiment of the invention.

The solid-state image pickup device 30 illustrated in FIG. 4 is configured so that, over a Si substrate 41, an R photoelectric conversion element including a lower electrode 101r, a photoelectric conversion layer 102r stacked over the lower electrode 101r, a hole blocking layer 103r (omitted from the drawing) formed over the photoelectric conversion layer 102r, and an upper electrode 104r stacked over the hole blocking layer 103r, a B photoelectric conversion element including a lower electrode 101b, a photoelectric conversion layer 102b stacked over the lower electrode 101b, a hole blocking layer 103b (omitted from the drawing) formed over the photoelectric conversion layer 102b, and an upper electrode 104b stacked over the hole blocking layer 103b, and a G photoelectric conversion element including a lower electrode 101g, a photoelectric conversion layer 102g stacked over the lower electrode 101g, a hole blocking layer 103g (omitted from the drawing) formed over the photoelectric conversion layer 102g, and an upper electrode 104g stacked over the hole blocking layer 103g are stacked in order of mention while directing their respective lower electrodes toward the side of the Si substrate 41.

Over the silicon substrate 41, a transparent insulating film 48, the R photoelectric conversion element, a transparent insulating film 59, the B photoelectric conversion element, a transparent insulating film 63, the G photoelectric conversion element, a light shielding film 68 having an opening therein, and a transparent insulating film 67 are formed successively in order of mention.

The lower electrode 101g, the photoelectric conversion layer 102g, the hole blocking layer 103g, and the upper electrode 104g which are included in the G photoelectric conversion element have a similar structure to the lower electrode 101, the photoelectric conversion layer 102, the hole blocking layer 103, and the upper electrode 104 illustrated in FIG. 1, respectively, except that the photoelectric conversion layer 102g is made of an organic material capable of absorbing green light and generating electrons and holes responsive thereto.

The lower electrode 101b, the photoelectric conversion layer 102b, the hole blocking layer 103b, and the upper electrode 104b which are included in the B photoelectric conversion element have a similar structure to the lower electrode 101, the photoelectric conversion layer 102, the hole blocking layer 103, and the upper electrode 104 illustrated in FIG. 1, respectively, except that the photoelectric conversion layer 102b is made of an organic material capable of absorbing blue light and generating electrons and holes responsive thereto.

The lower electrode 101r, the photoelectric conversion layer 102r, the hole blocking layer 103r, and the upper electrode 104r which are included in the R photoelectric conversion element have a similar structure to the lower electrode 101, the photoelectric conversion layer 102, the hole blocking layer 103, and the upper electrode 104 illustrated in FIG. 1, respectively, except that the photoelectric conversion layer 102r is made of an organic material capable of absorbing red light and generating electrons and holes responsive thereto.

In a portion in the surface of the Si substrate 41 which portion is shielded by the light shielding film 68, $n^+$ regions 43, 45, and 47 are formed and these regions are encompassed with p regions 42, 44, and 46, respectively.

The $n^+$ region 43 is electrically connected to the lower electrode 101r via a connecting section 54 formed in an opening made in the insulating film 48. Holes collected in the lower electrode 101r recombine with electrons in the $n^+$ region 43 so that the number of electrons stored at the time of reset in the $n^+$ region 43 decreases, depending on the number of collected holes. The connecting portion 54 is electrically insulated by an insulating film 51 from members other than the lower electrode 101r and the $n^+$ region 43.

The $n^+$ region 45 is electrically connected to the lower electrode 101b via a connecting portion 53 formed in an opening made in the insulating film 48, the R photoelectric conversion element, and the insulating film 59. Holes collected in the lower electrode 101b recombine with electrons in the $n^+$ region 45 so that the number of electrons stored at the time of reset in the $n^+$ region 45 decreases depending on the number of collected holes. The connecting portion 53 is electrically insulated by an insulation film 50 from members other than the lower electrode 101b and the $n^+$ region 45.

The $n^+$ region 47 is electrically connected to the lower electrode 101g via a connecting portion 52 formed in an opening made in the insulating film 48, the R photoelectric conversion element, the insulating film 59, the B photoelectric conversion element, and the insulating film 63. Holes collected in the lower electrode 101g recombine with electrons in the $n^+$ region 47 so that the number of electrons stored at the time of reset in the $n^+$ region 47 decreases depending on the number of collected holes. The connecting portion 52 is electrically insulated by an insulation film 49 from members other than the lower electrode 101g and the $n^+$ region 47.

The electrons stored in the $n^+$ region 43 are converted into signals responsive to their charge quantity by a MOS circuit (not illustrated) composed of an n-channel MOS transistor formed in the p region 42; the electrons stored in the $n^+$ region 45 are converted into signals responsive to their charge quantity by a MOS circuit (not illustrated) composed of an n-channel MOS transistor formed in the p region 44; and the electrons stored in the $n^+$ region 47 are converted into signals responsive to their charge quantity by a MOS circuit (not illustrated) composed of an n-channel MOS transistor formed in the p region 46. All of these signals are output to the outside of the solid-state image pickup device 300. Each of the MOS circuits is connected to a signal readout pad not illustrated in the drawing by means of wiring 55. Alternatively, the signal readout portion may be composed of not an MOS circuit but a CCD and an amplifier. Described specifically, the signal readout portion may be configured so that electrons stored in the $n^+$ regions 43, 45, and 47 are read into a CCD formed in the Si substrate 41 and transferred to an amplifier with the CCD, and signals responsive to the holes are output from the amplifier.

In the above description, the photoelectric conversion layer capable of absorbing B light is a photoelectric conversion layer which is capable of absorbing light with at least a wavelength of from 400 to 500 nm and has preferably an absorptance of 50% or greater at the peak wavelength in this wavelength range; the photoelectric conversion layer capable of absorbing G light is a photoelectric conversion layer which is capable of absorbing light with at least a wavelength of from 500 to 600 nm and has preferably an absorptance of 50% or greater at the peak wavelength in this wavelength range;

and the photoelectric conversion layer capable of absorbing R light is a photoelectric conversion layer which is capable of absorbing light with at least a wavelength of from 600 to 700 nm and has preferably an absorptance of 50% or greater at the peak wavelength in this wavelength range.

Fifth Embodiment

Figure 5:
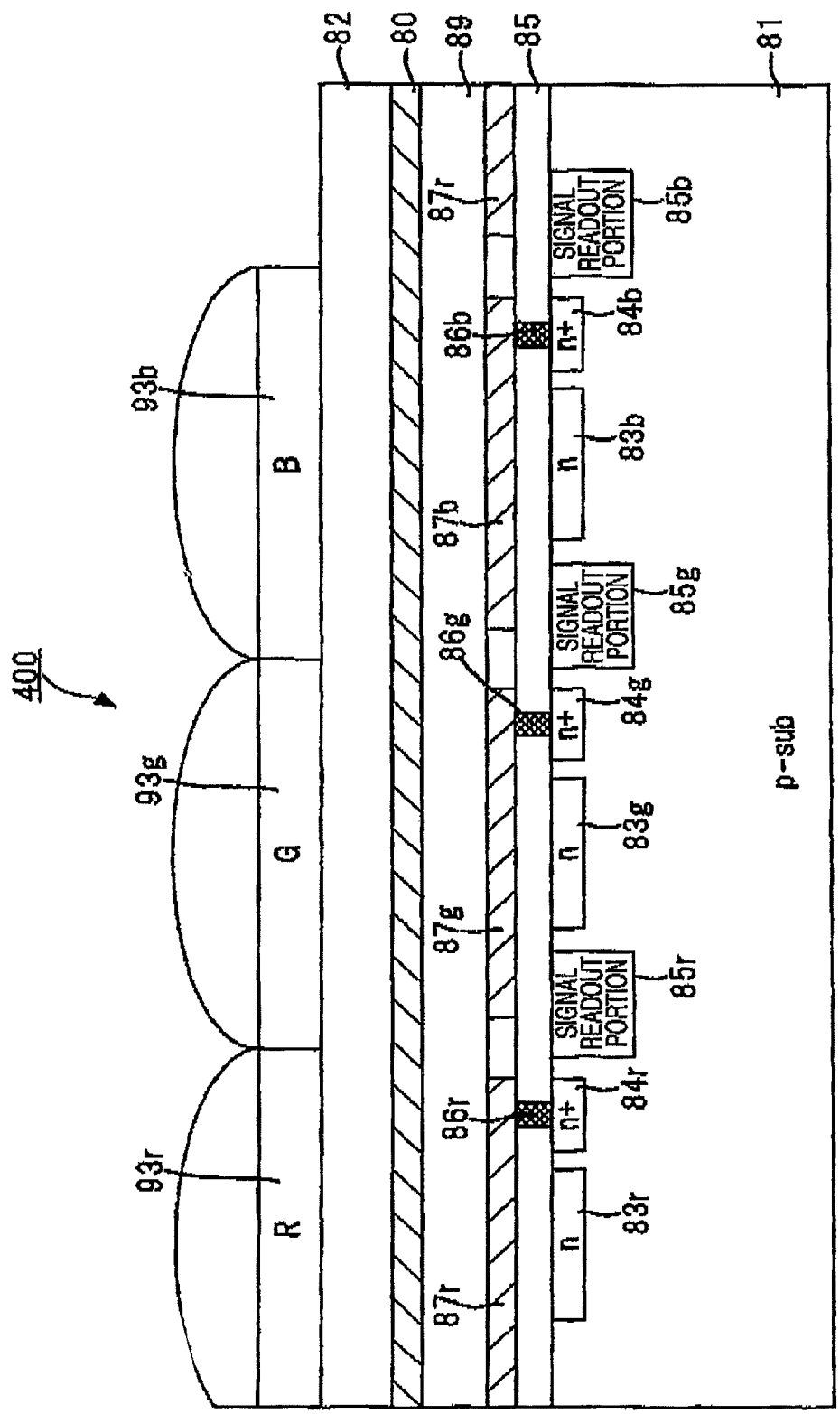
FIG. 5 is a cross-sectional schematic view of a solid-state image pickup device for describing a fifth embodiment of the invention.

FIG. 5 is a cross-sectional schematic view of a solid-state image pickup device for describing a fifth embodiment of the invention.

Many color filters 93*r* transmitting mainly light of an R wavelength range, many color filters 93*g* transmitting mainly light of a G wavelength range, and many color filters 93*b* transmitting mainly light of a B wavelength range are arranged in both a line direction and a direction perpendicular thereto on one plane over a p type Si substrate 81.

Known materials can be used for the color filter 93*r* and such materials are capable of transmitting light in a R wavelength range and in addition, transmitting some of light in an infrared range. Known materials can be used for the color filter 93*g* and such materials are capable of transmitting light in a G wavelength range and in addition, transmitting some of light in an infrared range. Known materials can be used for the color filter 93*b* and such materials are capable of transmitting light in a B wavelength range and in addition, transmitting some of light in an infrared range.

For arrangement of color filters 93*r*, 93*g*, and 93*b,* color filter arrangement (Bayer arrangement, vertical stripes, or horizontal stripes) employed for known single-chip solid-state image pickup devices can be used.

An n type impurity region (which will hereinafter be called "n region") 83*r* corresponding to the color filter 93*r* is formed below the color filter 93*r*. An R photoelectric conversion element corresponding to the color filter 93*r* is formed by the pn junction between the n region 83*r* and the p type Si substrate 81.

An n region 83*g* corresponding to the color filter 93*g* is formed below the color filter 93*g*. A G photoelectric conversion element corresponding to the color filter 93*g* is formed by the pn junction between the n region 83*g* and the p type Si substrate 81.

An n region 83*b* corresponding to the color filter 93*b* is formed below the color filter 93*b*. A B photoelectric conversion element corresponding to the color filter 93*b* is formed by the pn junction between the n region 83*b* and the p type Si substrate 81.

A lower electrode 87*r* (having a similar function to that of the lower electrode 101 of FIG. 1) is formed over the n region 83*r*; a lower electrode 87*g* (having a similar function to that of the lower electrode 101 of FIG. 1) is formed over the n region 83*g*; and a lower electrode 87*b* (having a similar function to that of the lower electrode 101 of FIG. 1) is formed over the n region 83*b*. The lower electrodes 87*r*, 87*g*, and 87*b* are divided so as to correspond to the color filters 93*r*, 93*g*, and 93*b*, respectively. The lower electrodes 87*r*, 87*g*, and 87*b* are each made of a material transparent to visible light and infrared light and, for example, ITO and indium zinc oxide (IZO) are usable as the material. The transparent electrodes 87*r*, 87*g*, and 87*b* are each buried in an insulating layer.

A photoelectric conversion layer 89 (having a similar function to that of the photoelectric conversion layer 102 of FIG. 1) having a monolithic structure common to the color filters 93*r*, 93*g*, and 93*b*, which absorbs mainly light in an infrared range with a wavelength of 580 nm or greater, generates charges responsive thereto, and transmits light in a visible range (wavelength of from about 280 nm to about 580 nm) other than an infrared range. The photoelectric conversion layer 89 is made of a material such as a phthalocyanine organic material or a naphthalocyanine organic material.

Over the photoelectric conversion layer 89, a hole blocking layer illustrated in FIG. 1 is formed, though it is not illustrated in the drawing. An upper electrode 80 (having a similar function to that of the upper electrode 104 of FIG. 1) having a monolithic structure common to the color filters 93*r*, 93*g*, and 93*b* are formed over the hole blocking layer. The upper electrode 80 is made of a material transparent to visible light and infrared light and, for example, ITO or IZO is usable as the material. The hole blocking layer not illustrated in the drawing and formed between the photoelectric conversion layer 89 and the upper electrode 80 has a similar function to that of the hole blocking layer 103 of FIG. 1.

A photoelectric conversion element corresponding to the color filter 93*r* is formed from the lower electrode 87*r*, the upper electrode 80 opposed thereto, and a portion of the photoelectric conversion layer 89 sandwiched therebetween. This photoelectric conversion element will hereinafter be called "R over-substrate photoelectric conversion element" because it is formed over a semiconductor substrate.

A photoelectric conversion element corresponding to the color filter 93*g* is formed from the lower electrode 87*g*, the upper electrode 80 opposed thereto, and a portion of the photoelectric conversion layer 89 sandwiched therebetween. This photoelectric conversion element will hereinafter be called "G over-substrate photoelectric conversion element".

A photoelectric conversion element corresponding to the color filter 93*b* is formed from the lower electrode 87*b*, the upper electrode 80 opposed thereto, and a portion of the photoelectric conversion layer 89 sandwiched therebetween. This photoelectric conversion element will hereinafter be called "B over-substrate photoelectric conversion element".

A high-concentration n type impurity region (which will hereinafter be called "$n^+$ region") 84*r* connected to the lower electrode 87*r* of the R over-substrate photoelectric conversion element is formed adjacent to the n region 83*r*. It is preferred to lay a light shielding film over the $n^+$ region 84*r* in order to prevent penetration of light into the $n^+$ region 84*r*.

An $n^+$ region 84*g* connected to the lower electrode 87*g* of the G over-substrate photoelectric conversion element is formed adjacent to the n region 83*g*. It is preferred to lay a light shielding film over the $n^+$ region 84*g* in order to prevent penetration of light into the $n^+$ region 84*g*.

An $n^+$ region 84*b* connected to the lower electrode 87*b* of the B over-substrate photoelectric conversion element is formed adjacent to the n region 83*b*. It is preferred to lay a light shielding film over the $n^+$ region 84*b* in order to prevent penetration of light into the $n^+$ region 84*b*.

A connecting portion 86*r* made of a metal such as tungsten or aluminum is formed over the $n^+$ region 84*r* and the lower electrode 87*r* is formed over the connecting portion 86*r*. The $n^+$ region 84*r* and the lower electrode 87*r* are electrically connected to each other via the connecting portion 86*r*. The connecting portion 86*r* is buried in an insulating layer 85 transparent to visible light and infrared light.

A connecting portion 86*g* made of a metal such as tungsten or aluminum is formed over the $n^+$ region 84*g* and the lower electrode 87*g* is formed over the connecting portion 86*g*. The $n^+$ region 84*g* and the lower electrode 87*g* are electrically connected to each other via the connecting portion 86*g*. The connecting portion 86*g* is buried in the insulating layer 85.

A connecting portion 86b made of a metal such as tungsten or aluminum is formed over the n+ region 84b and the lower electrode 87b is formed over the connecting portion 86b. The n+ region 84b and the lower electrode 87b are electrically connected to each other via the connecting portion 86b. The connecting portion 86b is buried in the insulating layer 85.

In regions other than the n regions 83r, 83g, and 83b, and n+ regions 84r, 84g, and 84b, there are formed a signal readout portion 85r made of n channel MOS transistors for reading out signals responsive to electrons stored in the n region 83r and the n+ region 84r, respectively; a signal readout portion 85g made of n channel MOS transistors for reading out signals responsive to electrons stored in the n region 83g and the n+ region 84g, respectively; and a signal readout portion 85b made of n channel MOS transistors for reading out signals responsive to electrons stored in the n region 83b and the n+ region 84b, respectively. The signal readout portions 85r, 85g, and 85b may each be made of a CCD. It is preferred to place a light shielding film over the signal readout portions 85r, 85g, and 85b in order to prevent penetration of light into the signal readout portions 85r, 85g, and 85b.

Such a constitution makes it possible to form an RGB color image and an infrared image at the same resolution so that the solid-state image pickup device having such a constitution can be utilized in electronic endoscopes.

EXAMPLES

Examples of the invention will hereinafter be described.

Example 1

As a lower electrode (hole collecting electrode), a glass substrate having a transparent electrode (film thickness: 100 nm) made of ITO formed thereon was used. The glass substrate was ultrasonically washed with a neutral detergent, pure water, and 2-propanol (IPA) successively and then, dried. A photoelectric conversion layer was then formed by stacking, over the glass substrate, Compound 1: 4,4',4"-tris (N-(3-methylphenyl)N-phenylamino) triphenylamine (m-MTDATA: film thickness of 100 nm), Compound 2: 5,12-dihydroquino[2,3-b]acridine-7,14-dione (quinacridone: film thickness of 150 nm), and Compound 3: tris(8-hydroxyquinolinato)aluminum (III) (Alq$_3$: film thickness of 50 nm), each shown below, successively by vapor deposition. Further, silicon monoxide (SiO) was heated and deposited at a degree of vacuum of $4 \times 10^{-6}$ Pa to form a hole blocking layer (film thickness: 20 nm). The composition ratio x of silicon oxide SiO$_x$ constituting the hole blocking layer was 1.1. An ITO film (film thickness: 5 nm) was formed as an upper electrode (electron collecting electrode) on the hole blocking layer by RF magnetron sputtering to complete the fabrication of an organic photoelectric conversion element. Steps from deposition to form the photoelectric conversion layer to sputtering to form the upper electrode including conveyance of the substrate were performed continuously in vacuum ($1 \times 10^{-1}$ Pa or less). The resulting element was then sealed by bonding a glass can having a desiccator made of calcium oxide attached thereto to the circumferential portion of the substrate with a UV curable epoxy resin in dry nitrogen without exposing the device to the atmosphere.

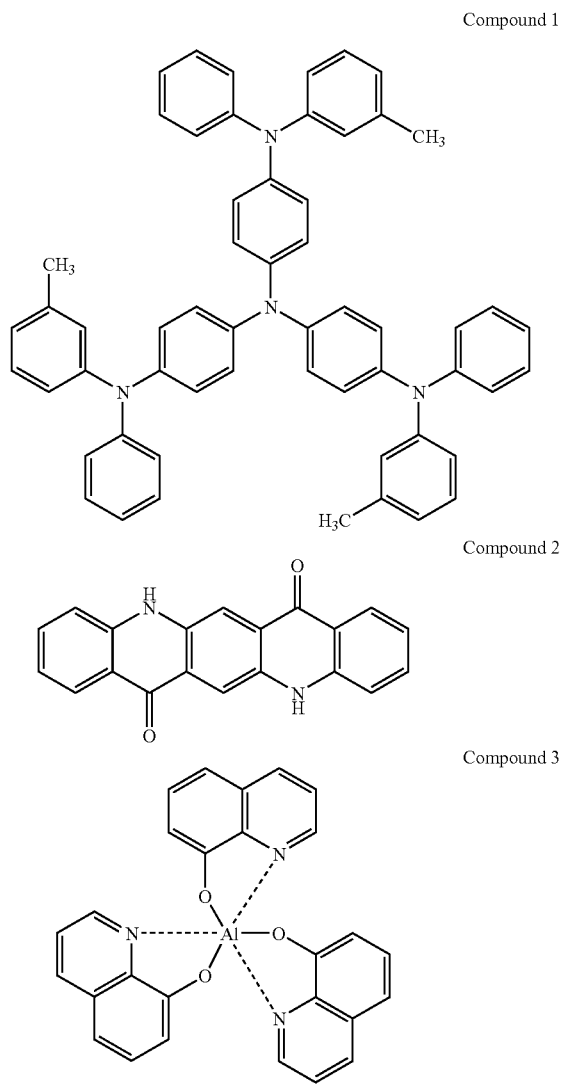

Example 2

In a similar manner to that employed in Example 1 except that the hole blocking layer was formed by heating and depositing SiO at a degree of vacuum of $4 \times 10^{-5}$ Pa, an organic photoelectric conversion element was manufactured. The composition ratio x of silicon oxide SiO$_x$ constituting the hole blocking layer thus formed was 1.2.

Comparative Example 1

In a similar manner to that employed in Example 1 except that the hole blocking layer was formed by heating and depositing SiO at a degree of vacuum of $4 \times 10^{-4}$ Pa by heating, an organic photoelectric conversion element was manufactured. The composition ratio x of silicon oxide SiO$_x$ constituting the hole blocking layer thus formed was 1.3.

Comparative Example 2

In a similar manner to that employed in Example 1 except that the hole blocking layer was formed by heating and depositing SiO at a degree of vacuum of $4 \times 10^{-3}$ Pa, an organic photoelectric conversion element was manufactured. The composition ratio x of silicon oxide $SiO_x$ constituting the hole blocking layer thus formed was 1.4.

Comparative Example 3

In a similar manner to that employed in Example 1 except the the hole blocking layer made of silicon oxide was not formed, an organic photoelectric conversion element was manufactured.

The lower electrode of each of the organic photoelectric conversion elements obtained in Examples 1 and 2, and Comparative Examples 1, 2 and 3 was connected to ground and a voltage of 15V was applied to the upper electrode. An external quantum efficiency (photocurrent) and a dark current were measured by irradiating light with a wavelength of 560 nm from the upper electrode side at an intensity of 50 μW·cm$^{-2}$. The results are shown in Table 1.

2 that when an oxygen composition x of silicon oxide $SiO_x$ becomes greater than 1.2, there is a tendency of a decrease in photocurrent, meaning that it tends to be difficult to read out signals. An electron affinity of each material will next be considered. Silicon dioxide $SiO_2$ is known to have an electron affinity of approximately 1 eV. Supposing from ionization potential and photoabsorption spectrum, $SiO_{1.1}$ to $SiO_{1.2}$ has an electron affinity of 3 eV or greater and that of $Alq_3$ is approximately 3 eV. Excitons generated in a photoelectric conversion layer are separated into electrons and holes by a voltage applied to the device, that is, electric field. Electrons are collected as signals by the upper electrode having a positive voltage (15V). The hole blocking layer between the photoelectric conversion layer and the upper electrode has, when it is made of $SiO_{1.1}$ to $SiO_{1.2}$ (Examples 1 and 2) an electron affinity equal to or greater than that of $Alq_3$ so that it does not disturb conduction of electrons. As x of $SiO_x$ becomes greater and the composition approaches that of $SiO_2$, electron affinity

TABLE 1

|  | Ex. 1 | Ex. 2 | Comp. Ex. 1 | Comp. Ex. 1 | Comp. Ex. 3 |
| --- | --- | --- | --- | --- | --- |
| Composition ratio x of $SiO_x$ | 1.1 | 1.2 | 1.3 | 1.4 | No $SiO_x$ layer |
| External quantum efficiency (%) | 30 | 30 | 25 | 17 | 30 |
| Photocurrent (A·cm$^{-2}$) | $3.0 \times 10^{-6}$ | $3.0 \times 10^{-6}$ | $2.5 \times 10^{-6}$ | $1.7 \times 10^{-6}$ | $3.0 \times 10^{-6}$ |
| Dark current (A·cm$^{-2}$) | $1.9 \times 10^{-10}$ | $1.7 \times 10^{-10}$ | $1.9 \times 10^{-10}$ | $1.8 \times 10^{-10}$ | $1.5 \times 10^{-6}$ |
| SN ratio | $1.6 \times 10^4$ | $1.8 \times 10^4$ | $1.3 \times 10^4$ | $9.4 \times 10^3$ | $2.0 \times 10^3$ |

As a result of comparison of the results between Examples 1 and 2 and Comparative Example 3, it has been found that in an organic photoelectric conversion element, formation of a hole blocking layer made of silicon oxide ($SiO_{1.1}$ to $SiO_{1.2}$) between an upper electrode (electron collecting electrode) made of ITO and a photoelectric conversion layer enables effective reduction in a dark current and drastic improvement in an SN ratio without reducing the external quantum efficiently. According to ultraviolet photoelectron spectroscopy (UPS), the work function of ITO is 4.5 eV, while the ionization potential of $Alq_3$ is 5.7 eV and ionization potential of $SiO_{1.1}$ to $SiO_{1.2}$ is from 6.3 to 6.4 eV. In the case of Comparative Example 3, a difference 1.2 eV between the ionization potential of $Alq_3$ and the work function of ITO becomes a hole injection barrier, while in the case of Examples 1 and 2, a difference from 1.8 to 1.9 eV between the ionization potential of $SiO_{1.1}$ to $SiO_{1.2}$ and the work function of ITO becomes a hole injection barrier. A reduction in a dark current is presumed to occur as a result of an increase of a hole injection barrier from the upper electrode made of ITO by introducing the hole blocking layer made of silicon oxide. In Comparative Example 3, $Alq_3$ molecules which have deteriorated due to formation of ITO directly on $Alq_3$ by sputtering may form an intermediate level on the $Alq_3$-ITO interface. Hole injection from the upper electrode made of ITO via the intermediate level leads to a decrease in hole injection barrier and an increase in dark current. It is on the other hand presumed that in Examples 1 and 2, generation of an intermediate level is prevented and dark current does not increase by introducing the hole blocking layer made of stable silicon oxide.

It has been found as a result of comparison between the results of Examples 1 and 2 and Comparative Examples 1 and 2 that the oxygen composition ratio x of silicon oxide $SiO_x$ becomes 1.2 or less by adjusting the degree of vacuum at the time of heating and depositing SiO to $1 \times 10^{-4}$ Pa or less.

monotonously decreases to 1 eV. When x of $SiO_x$ exceeds 1.2 (Comparative Examples 1 and 2), the electron affinity becomes smaller than that of $Alq_3$ so that the hole blocking layer is presumed to become a barrier for conduction of electrons.

Example 3

In a similar manner to that employed in Example 1 except that the hole blocking layer (film thickness: 20 nm) was prepared by, instead of heating and depositing SiO, RF magnetron sputtering using an Si target, Ar gas, and $O_2$ gas at a degree of vacuum of $1 \times 10^{-1}$ Pa, organic photoelectric conversion elements were manufactured. The resulting organic photoelectric conversion elements had, as a hole blocking layer thereof, Si, $SiO_{0.5}$, $SiO_{1.0}$, $SiO_{1.5}$ and $SiO_{2.0}$, respectively, and they were obtained by controlling a flow rate ratio of Ar and $O_2$, thereby changing the composition ratio x of $SiO_x$. The lower electrode of each of these organic photoelectric conversion elements was connected to ground and a voltage of 15V was applied to the upper electrode. An external quantum efficiency (photocurrent) and a dark current were measured by irradiating light with a wavelength of 560 nm at an intensity of 50 μW·cm$^{-2}$. The results are shown in Table 2.

TABLE 2

| Composition ratio x of $SiO_x$ | 0 | 0.5 | 1.0 | 1.5 | 2.0 |
| --- | --- | --- | --- | --- | --- |
| External quantum efficiency (%) | — | 30 | 30 | 10 | 0 |
| Photocurrent (A·cm$^{-2}$) | — | $3.0 \times 10^{-6}$ | $3.0 \times 10^{-6}$ | $1.0 \times 10^{-6}$ | $3.8 \times 10^{-9}$ |
| Dark current (A·cm$^{-2}$) | $4.0 \times 10^{-6}$ | $2.9 \times 10^{-10}$ | $1.8 \times 10^{-10}$ | $1.8 \times 10^{-10}$ | $1.7 \times 10^{-10}$ |
| SN ratio | — | $1.0 \times 10^4$ | $1.6 \times 10^4$ | $5.6 \times 10^3$ | 22 |

The organic photoelectric conversion element obtained by sputtering Si (x=0) on $Alq_3$ while using only an Ar gas without using an $O_2$ gas had a markedly high dark current. As a result, an SN ratio at the time of measurement could not be obtained and a photocurrent was unmeasurable. The film obtained by Si sputtering was amorphous and according to electron spin resonance (ESR) measurement, the concentration of defects (Pb center) was $10^{19}$ $cm^{-3}$. These high concentration defects are presumed to be a generation source of carriers, that is, a source of a dark current when an electric field was applied to the device. In order to decrease defects of an amorphous Si film which will be a cause of an increase in a dark current, it is preferred to introduce an $H_2$ gas during sputtering to make Si into so-called "amorphous silicon hydride (a-Si:H)" as generally known. Chemical vapor deposition (CVD) process using silicon hydride such a $SiH_4$ is more preferred because it facilitates formation of a film of a-Si:H.

When attention is paid to an external quantum efficiency together with the results of Examples 1 and 2 and Comparative Examples 1, 2 and 3, an organic photoelectric conversion element having $SiO_x$ having x of 1.2 or less introduced therein as the hole blocking layer showed an efficiency of 30% equal to that of a device having no $SiO_x$ introduced therein. On the other hand, when x exceeds 1.2, the efficiency decreases. Use of silicon oxide $SiO_2$ as the hole blocking layer results in complete absence of the external quantum efficiency. As described above in the consideration in the electron affinity, it is presumed that when x exceeds 1.2, the electron affinity of $SiO_x$ becomes smaller than that of $Alq_3$ of the photoelectric conversion layer and the $SiO_x$ layer becomes a barrier for electron transfer, which leads to a decrease in a photocurrent. This means that when silicon oxide $SiO_x$ is utilized as a hole blocking layer placed adjacent to a material (for example, $Alq_3$) having an ionization potential of approximately 5.7 eV, the oxygen composition x is preferably 1.2 or less.

With regards to a dark current, the dark current of a device having the oxygen composition x of 0.5 or greater is smaller by one order of magnitude than that of a device having no $SiO_x$ layer. As described above, UPS measurement has revealed that ionization potential of $SiO_{1.5}$ is 6.8 eV and that of $SiO_{0.5}$ is 5.7 eV, showing that an ionization potential decreases monotonously with a decrease in the value of x. The ionization potential of $Alq_3$ is 5.7 eV so that $SiO_{0.5}$ and $Alq_3$ are equal in the hole injection barrier. It is presumable that when x of $SiO_x$ is less than 0.5, the ionization potential becomes smaller than that of $Alq_3$, which leads to a decrease in the hole injection barrier and rather an increase in the dark current. This means that when silicon oxide $SiO_x$ is utilized as a hole blocking layer placed adjacent to a material (for example, $Alq_3$) having an ionization potential of approximately 5.7 eV, the oxygen composition x is preferably 0.5 or greater.

It has been found from the above-described examples that by using $SiO_x$ as the hole blocking layer 103 and adjusting the composition ratio x of $SiO_x$ to 0.5 or greater and 1.2 or less, the hole injection from the upper electrode 104 can be suppressed without deteriorating the related-art electron transporting performance.

Example 4

An ITO film (thickness: 30 nm) was formed on an Si substrate equipped with a CMOS signal readout circuit and a signal charge storage diode by RF magnetron sputtering. As a lower electrode (hole collecting electrode), 57000 pieces (250×228 pieces in square) of ITO electrodes (14 μm square, at intervals of 4 μm) were formed by photolithography. Each of the lower electrodes was connected to the corresponding signal charge storage diode via a via plug. After dicing the Si substrate into chips, these chips were brought into contact with a ceramic package, followed by wire bonding. The resulting chips were each ultrasonically washed with a neutral reagent, pure water, and IPA successively and then dried. As in Example 1, Compound 1 (film thickness: 100 nm), Compound 2 (film thickness: 150 nm), and Compound 3 (film thickness: 50 nm) were stacked successively on the lower electrode to form a photoelectric conversion layer. SiO (film thickness: 20 nm) was heated and deposited at a degree of vacuum of $4\times10^{-5}$ Pa to form a hole blocking layer. ITO (film thickness: 5 nm) was then deposited as an upper electrode (electron collecting electrode) on the hole blocking layer by RF magnetron sputtering to complete the fabrication of an organic photoelectric conversion element. Steps from deposition to form the photoelectric conversion layer to sputtering to form the upper electrode including conveyance of the substrate were performed continuously in vacuum ($1\times10^{-1}$ Pa or less). The resulting device was then sealed by bonding a glass can having a desiccator made of calcium oxide attached thereto to the package with a UV curable epoxy resin in dry nitrogen without exposing the device to the atmosphere.

Comparative Example 4

In a similar manner to Example 4 except that the hole blocking layer made of silicon oxide was not formed, a solid-state image pickup device was manufactured.

Figure 6:
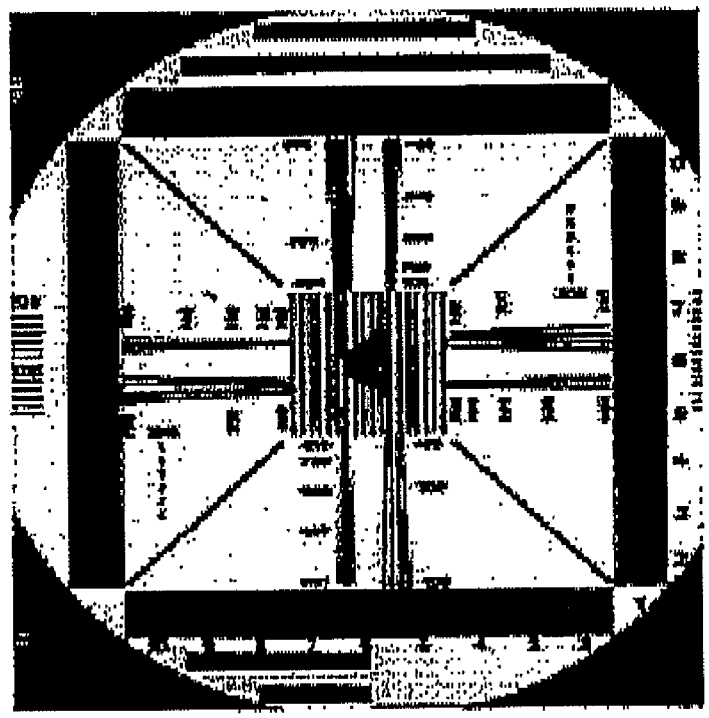
FIG. 6 illustrates the image formed using the solid-state image pickup device of Example 4.
Figure 7:
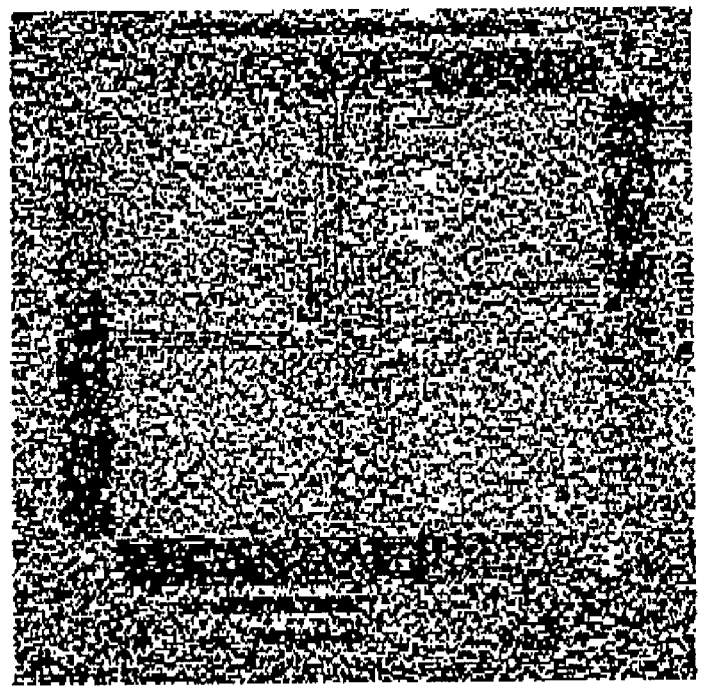
FIG. 7 illustrates the image formed using the solid-state image pickup device of Comparative Example 4.

The solid-state imaging devices obtained in Example 4 and Comparative Example 4 were each installed in a camera and an image of an EIAJ test chart A was taken. A voltage of 15V was applied to the upper electrode and holes were collected in each lower electrode. The holes thus collected were stored in the signal charge storage diode connected to the lower electrode and signals were read out sequentially from the CMOS circuit. FIG. 6 illustrates the result of an image taken using the device of Example 4, while FIG. 7 illustrates the result of an image taken using the device of Comparative Example 4.

It has been found from FIG. 6 that the solid-state image pickup device obtained in Example 4 provides a noise-free vivid image. As the results of Example 2 suggest, such an image can be produced by introducing a hole blocking layer made of silicon oxide between the electron collecting electrode (upper electrode) and photoelectric conversion layer of the photoelectric conversion device, thereby suppressing the dark current to less than 1 $nA \cdot cm^{-2}$ and achieving a high SN ratio. The image provided by the solid-state image pickup device obtained in Comparative Example 4, on the other hand, was very noisy, had white spots distributed over the whole image, and had only unclear chart patterns. As the results of Comparative Example 3 suggest, although an external quantum efficiency becomes 30% or greater and enough for obtaining signals, a dark current exceeds 1 $nA \cdot cm^{-2}$, leading to deterioration in an SN ratio.

Example 5

As a lower electrode (electron collecting electrode), a glass substrate having thereon a transparent electrode (film thickness: 100 nm) made of ITO was used. The glass substrate was ultrasonically washed successively with a neutral detergent, pure water, and IPA and then dried. SiO was then heated and deposited on the substrate at a degree of vacuum of $4\times10^{-5}$ Pa to form a hole blocking layer (film thickness: 40 nm) made of $SiO_{1.2}$. Without changing the vacuum condition, the following compound 4, that is, bis(trihexylsiloxy)silicon-2,3-naphthalocyanine and $C_{60}$ were co-deposited at a volume ratio of 3:1 to form a photoelectric conversion layer (film thickness: 30 nm). Further, Compound 1, that is, m-MTDATA was vacuum deposited as a hole transport layer (film thickness: 100 nm) on the photoelectric conversion layer. Then, ITO (film thickness: 5 nm) was deposited by RF magnetron sputtering as an upper electrode to complete the fabrication of an organic photoelectric conversion element. Steps from deposition to form the hole blocking layer to sputtering to form the upper electrode including conveyance of the substrate were performed continuously in vacuum ($1 \times 10^{-1}$ Pa or less). The resulting device was then sealed by bonding a glass can having a desiccator made of calcium oxide attached thereto to the circumferential portion of the substrate with a UV curable epoxy resin in dry nitrogen without exposing the device to the atmosphere.

Compound 4

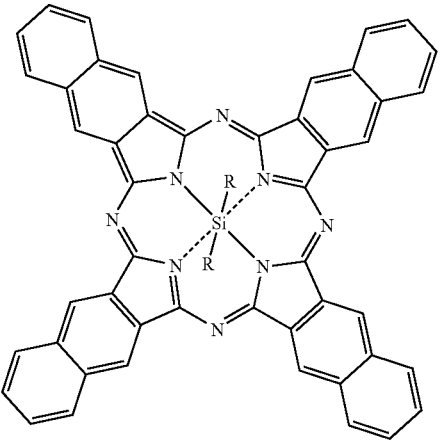

$R = OSi(C_6H_{13})_3$

Comparative Example 5

In a similar manner to Example 5 except that the hole blocking layer made of $SiO_x$ was not formed, an organic photoelectric conversion element was manufactured.

The upper electrode of each of the organic photoelectric conversion elements obtained in Example 5 and Comparative Example 5 was connected to ground and a voltage of 12V was applied to the lower electrode. An external quantum efficiency (photocurrent) and a dark current were measured by irradiating light with a wavelength of 800 nm from the side of the upper electrode at an intensity of 50 μW·cm$^{-2}$. The results are shown in Table 3.

TABLE 3

|  | Ex. 5 | Comp. Ex. 5 |
| --- | --- | --- |
| External quantum efficiency (%) | 27 | — |
| Photocurrent (A · cm$^{-2}$) | $3.8 \times 10^{-6}$ | — |
| Dark current (A · cm$^{-2}$) | $8.1 \times 10^{-10}$ | $7.6 \times 10^{-6}$ |
| SN ratio | $4.7 \times 10^{3}$ | — |

The organic photoelectric conversion element obtained in Example 5 had a dark current of 1 nA·cm$^{-2}$ or less and therefore had a sufficient SN ratio On the other hand, a very large dark current of the device obtained in Comparative Example 5 made it impossible to obtain an SN ratio at the time of measurement and a photocurrent was therefore unmeasurable. When the lower electrode is functioned as an electron collecting electrode, local electric field concentration occurs due to adhesion of fine dust (particles) or presence of minute irregularities on the electrode surface which inevitably occur during the fabrication of the device and accelerates hole injection from the lower electrode to the organic photoelectric conversion layer. This results in a large dark current as in Comparative Example 5. When the hole blocking layer made of $SiO_x$ is formed on the lower electrode as in Example 5, on the other hand, generation of a dark current is presumed to be suppressed because even if local electric field concentration occurs on the surface of the lower electrode, a sufficiently large hole injection barrier at an ITO-$SiO_x$ interface remarkably relaxes the hole injection due to electric field concentration.

The entire disclosure of each and every foreign patent application from which the benefit of foreign priority has been claimed in the present application is incorporated herein by reference, as if fully set forth.

What is claimed is:

1. A photoelectric conversion element comprising:
   a pair of electrodes; and
   an organic photoelectric conversion layer between the pair of electrodes,
   wherein one of the electrodes is a first electrode that collects electrons generated in the organic photoelectric conversion layer;
   the other one of the electrodes is a second electrode that collects holes generated in the organic photoelectric conversion layer; and
   the photoelectric conversion element further comprises a hole blocking layer that comprises silicon oxide and inhibits injection of holes into the organic photoelectric conversion layer from the first electrode while applying a bias voltage between the electrodes, the hole blocking layer being disposed between the first electrode and the organic photoelectric conversion layer, and
   an oxygen/silicon composition ratio of the silicon oxide is 1.1 or greater and 1.2 or less.

2. A photoelectric conversion element according to claim 1, wherein at least one of the electrodes comprises a transparent conductive oxide.

3. A solid-state image pickup device comprising:
   a substrate;
   a photoelectric conversion element as claimed in claim 1 over the substrate; and
   a signal readout portion that reads out signals responsive to signal charges generated in the photoelectric conversion element.

4. A solid-state image pickup device according to claim 3, further comprising, in the substrate, another photoelectric conversion element that detects light which has passed through the photoelectric conversion element.

5. A solid-state image pickup device according to claim 3, wherein the signal readout portion is a CMOS type or a CCD type signal readout portion.

6. A solid-state image pickup device according to claim 3 wherein the substrate, the second electrode and the first electrode are arranged in this order;
   the device further comprises, in the substrate, an electron storage portion that collects holes collected by the hole collecting electrode; and
   the signal readout portion outputs signals responsive to the electrons stored in the electron storage portion.

7. A photoelectric conversion element according to claim 1, wherein the hole blocking layer is in direct contact with the first electrode.

8. A photoelectric conversion element according to claim 7, wherein the hole blocking layer is in direct contact with the organic photoelectric conversion layer.

9. A photoelectric conversion element according to claim 8, wherein the hole blocking layer has an electron affinity equal to or greater than that of the organic photoelectric conversion layer.

10. A photoelectric conversion element according to claim 9, wherein the hole blocking layer has an ionization potential greater than that of the organic photoelectric conversion layer.

11. A photoelectric conversion element according to claim 9, wherein the organic photoelectric conversion layer comprises a plurality of layers, and the hole blocking layer has an electron affinity equal to or greater than that of one layer of the plurality of layers, the one layer being in direct contact with the hole blocking layer.

12. A photoelectric conversion element according to claim 9, wherein the organic photoelectric conversion layer comprises a plurality of layers, and the hole blocking layer has an ionization potential greater than that of one layer of the plurality of layers, the one layer being in direct contact with the hole blocking layer.

13. A photoelectric conversion element according to claim 1, wherein the hole blocking layer is amorphous.

* * * * *